United States Patent
Taylor et al.

(10) Patent No.: US 10,135,440 B2
(45) Date of Patent: Nov. 20, 2018

(54) MAGNETIC FIELD TRIGGERING

(71) Applicant: PNI Sensor Corporation, Santa Rosa, CA (US)

(72) Inventors: Andrew T. Taylor, Santa Rosa, CA (US); Tyler Bryant, Santa Rosa, CA (US); Joseph F. Miller, Santa Rosa, CA (US)

(73) Assignee: PNI Sensor, Santa Rosa, CA (US)

( * ) Notice: Subject to any disclaimer, the term of this patent is extended or adjusted under 35 U.S.C. 154(b) by 0 days.

(21) Appl. No.: 15/486,501

(22) Filed: Apr. 13, 2017

(65) Prior Publication Data

US 2018/0302087 A1    Oct. 18, 2018

(51) Int. Cl.
   *G01R 33/02*   (2006.01)
   *H03K 17/95*   (2006.01)
   *G01R 33/00*   (2006.01)

(52) U.S. Cl.
   CPC ....... *H03K 17/953* (2013.01); *G01R 33/0017* (2013.01); *G01R 33/0082* (2013.01); *G01R 33/02* (2013.01)

(58) Field of Classification Search
   CPC ............ G01R 33/0017; G01R 33/0082; G01R 33/02; H03K 17/95; H03K 17/952; H03K 17/953
   USPC .......................................................... 327/517
   See application file for complete search history.

(56) References Cited

U.S. PATENT DOCUMENTS

| | | | |
|---|---|---|---|
| 4,203,109 A | 5/1980 | Ballard et al. | |
| 5,239,264 A | 8/1993 | Hawks | |
| 8,749,231 B2 | 6/2014 | Taylor et al. | |
| 9,141,194 B1* | 9/2015 | Keyes | G06F 3/017 |
| 2007/0064471 A1 | 3/2007 | Daily | |
| 2016/0123770 A1* | 5/2016 | Feucht | G01D 5/145 |
| | | | 324/207.2 |
| 2017/0289671 A1* | 10/2017 | Patel | H04R 1/1041 |

* cited by examiner

*Primary Examiner* — William Hernandez
(74) *Attorney, Agent, or Firm* — Brian R. Short

(57) ABSTRACT

Apparatuses, methods and systems for an event-triggering apparatus are disclosed. One embodiment of the apparatus includes a sensor element operative to sensing a magnetic field, and apparatus control circuitry, wherein the apparatus control circuitry receives a representation of the sensed magnetic field. The apparatus control circuitry is operative to sense a deviation in the sensed magnetic field greater than a predetermined threshold, and trigger an event after sensing the deviation of the sensed magnetic field greater than the predetermined threshold.

29 Claims, 15 Drawing Sheets

MAGNETIC FIELD TRIGGERING

FIELD OF THE EMBODIMENTS

The described embodiments relate generally to communication using magnetic fields. More particularly, the described embodiments relate to apparatuses, methods and systems for triggering based on sensing changes to a magnetic field.

BACKGROUND

It can be difficult to communicate with a device within an RF shielded environment. For example, communication with an underground or underwater device can be difficult due to signal attenuation. Further, the device can be located in difficult to reach places making it hard to interact with the device.

It is desirable to have apparatuses, methods, and systems for triggering based on sensed changes to a magnetic field.

SUMMARY

An embodiment includes an apparatus. The apparatus includes a sensor element operative to sensing a magnetic field, and apparatus control circuitry, wherein the apparatus control circuitry receives a representation of the sensed magnetic field. The apparatus control circuitry is operative to sense a deviation in the sensed magnetic field greater than a predetermined threshold, and trigger an event after sensing the deviation of the sensed magnetic field greater than the predetermined threshold.

Another embodiment includes a method. The method includes sensing, by a magnetic sensor element, a magnetic field, sensing a deviation in the sensed magnetic field greater than a predetermined threshold, and triggering, by control circuitry, an event after sensing the deviation of the sensed magnetic field greater than the predetermined threshold.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide for apparatuses, methods, and systems for magnetic field event triggering. For an embodiment, the triggering includes at least one of an electronic wakeup, electronic unlocking, or a triggering of an event. An embodiment includes an apparatus that is located in a difficult to access location (such as, underground or underwater) wherein the apparatus is operative to sense a deviation in a magnetic field greater than a predetermined threshold, and trigger an event after sensing the deviation of the sensed magnetic field greater than the predetermined threshold. For an embodiment, the magnetic field is created by an object (such as a vehicle) that generates a magnetostatic field which is sensed by the apparatus. For an embodiment, the magnetic field is generated and applied by an activation device. Accordingly, the activation device can be used for interfacing with the difficult to access apparatus.

For at least some embodiments, sensing, by the apparatus, a sequence of specifically timed changes to the applied magnetic field provides the triggering. At least some embodiments include a secure switch or wake-up sensor.

For at least some embodiments, the sensed magnetic fields include magneto-static fields. A magneto-static field is a magnetic field in systems where the currents are steady (not changing with time). It is the magnetic analogue of an electrostatic field where the charges are stationary. The magnetization need not be static; the equations of magnetostatics can be used to predict fast magnetic switching events that occur on time scales of nanoseconds or less. Magnetostatics can be a good approximation of a magnetic field even when the currents are not static—as long as the currents do not alternate rapidly. Magnetostatics is widely used in applications of micromagnetics such as models of magnetic recording devices.

Figure 1:
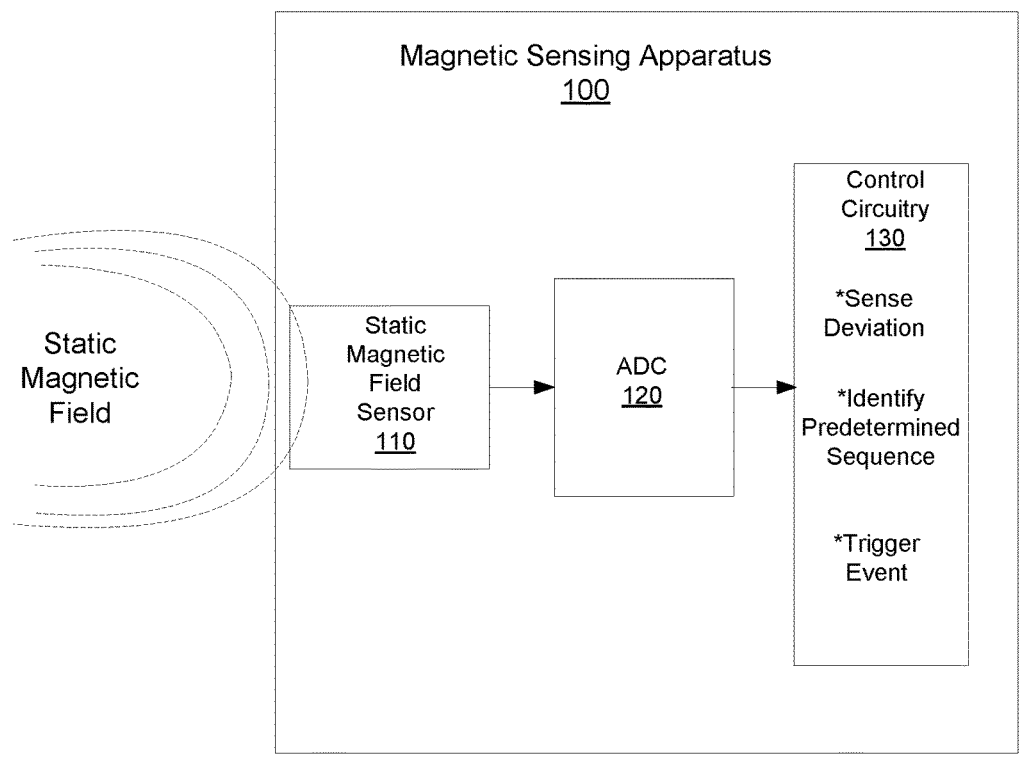
FIG. 1 shows a magnetic sensing apparatus, according to an embodiment.

FIG. 1 shows a magnetic sensing apparatus 100, according to an embodiment. The magnetic sensing apparatus includes a magnetic field sensor element 110, an ADC (analog to digital converter) 120, and control circuitry 130. The magnetic field sensor element 110 senses and applied magnetic field. For an embodiment, the ADC 120 samples the sensed magnetic field. The control circuitry 130 receives digital samples of the sensed magnetic field.

For at least some embodiments, the control circuitry 130 receives a representation (for example, the digital samples)

of the sensed magnetic field, and senses deviations in the sensed magnetic field. The sensed variations include changes in the magnitude of the applied magnetic field of the greater than a threshold.

For at least some embodiments, the control circuitry 130 identifies a predetermined sequence of sensed deviations of the sensed magnetic field over a plurality of time intervals after sensing the deviation in the sensed magnetic field greater than the predetermined threshold.

For at least some embodiments, the control circuitry 130 triggers an event after identifying the predetermined sequence of sensed deviations of the sensed magnetic field over the plurality of time intervals.

For at least some embodiments, the magnetic field includes a drift. That is, the magnetic field is not absolutely static.

For an embodiment, the control circuitry 130 includes a controller. For an embodiment, the control circuitry 130 includes circuitry, such as, an FPGA (field programmable gate array), an ASIC (application specific integrated circuit), or other type of control circuitry. For an embodiment, the control circuitry 130 includes both a controller and other circuitry. For example, for an embodiment, the control circuitry 130 includes an ASIC that communicates magnetic sensing data and generates an interrupt signal when the sensed magnetic field exceeds a threshold. The interrupt wakes up a controller which can then receive the magnetic sensing data. This embodiment advantageously allows the high-power controller to only be activated when the sensed magnetic field exceeds the threshold while the lower-power ASIC performs the magnetic sensing operations.

For an embodiment, the magnetic field sensor element 110 includes a magnetic sensor. For an embodiment, the magnetic field sensor element 110 includes a magnetic sensor and some associated circuitry. For example, for an embodiment, the magnetic field sensor element 110 includes the magnetic sensor and the ADC 120. Further, for an embodiment, the magnetic field sensor element 110 includes the magnetic sensor, the ADC 120, and control circuitry, such as, an ASIC.

Figure 2:
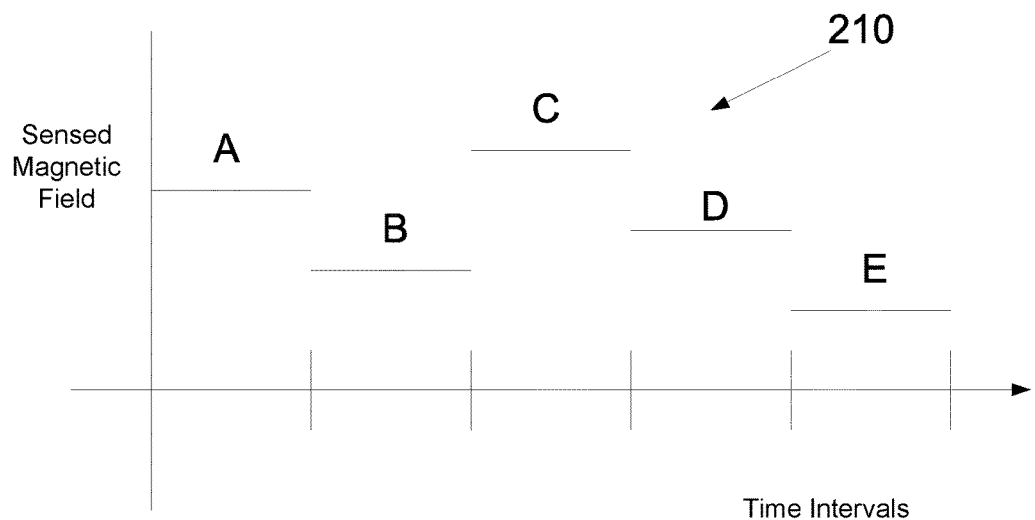
FIG. 2 shows sequences of sensed magnetic field deviations, according to an embodiment.
Figure 2:
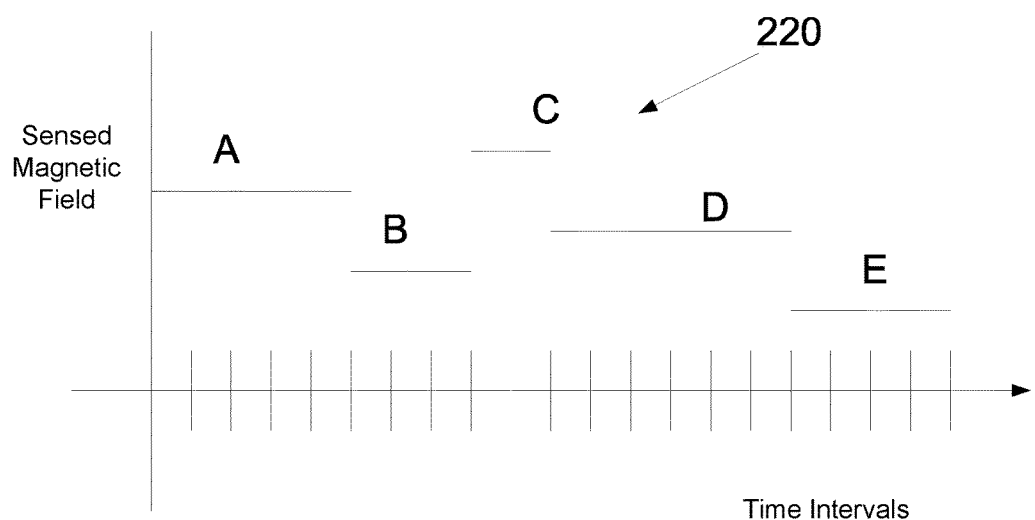

FIG. 2 shows sequences of sensed magnetic field deviations, according to an embodiment. That is, as stated, for at least some embodiment, the control circuitry 130 identifies a predetermined sequence of sensed deviations of the sensed magnetic field over a plurality of time intervals after sensing the deviation in the sensed magnetic field greater than the predetermined threshold. FIG. 2 shows such possible sequences. A first sequence 210 shows a series of sensed magnitude of a magnetic field have values of A, B, C, D, E. For an embodiment, specific sequences cause activation of the device. As described, the activation can include unlocking access, activating circuitry within the apparatus, or commanding the apparatus to perform an operation. Different sensed sequences can correspond to different actions performed by the apparatus. The second sequence includes the different sensed magnitudes remaining at specified levels for specified periods (changing) of time in order to cause a corresponding action by the apparatus.

Figure 3:
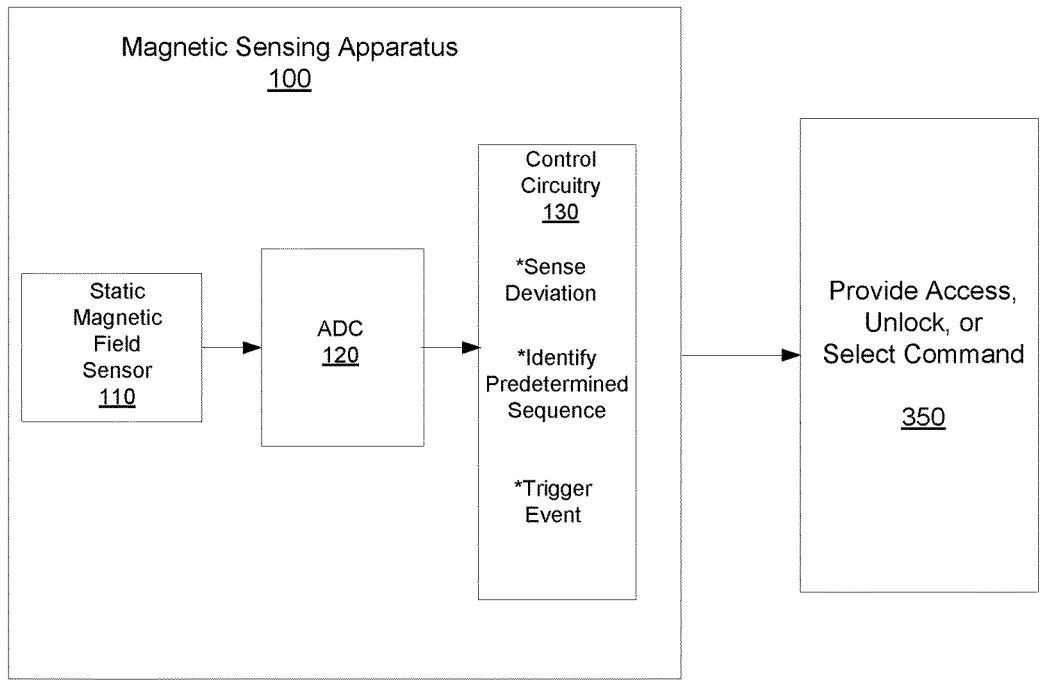
FIG. 3 shows a magnetic sensing apparatus which provide access, unlocks, or selects a command, according to an embodiment.

FIG. 3 shows a magnetic sensing apparatus which provide access, unlocks, or selects a command 350, according to an embodiment.

Figure 4:
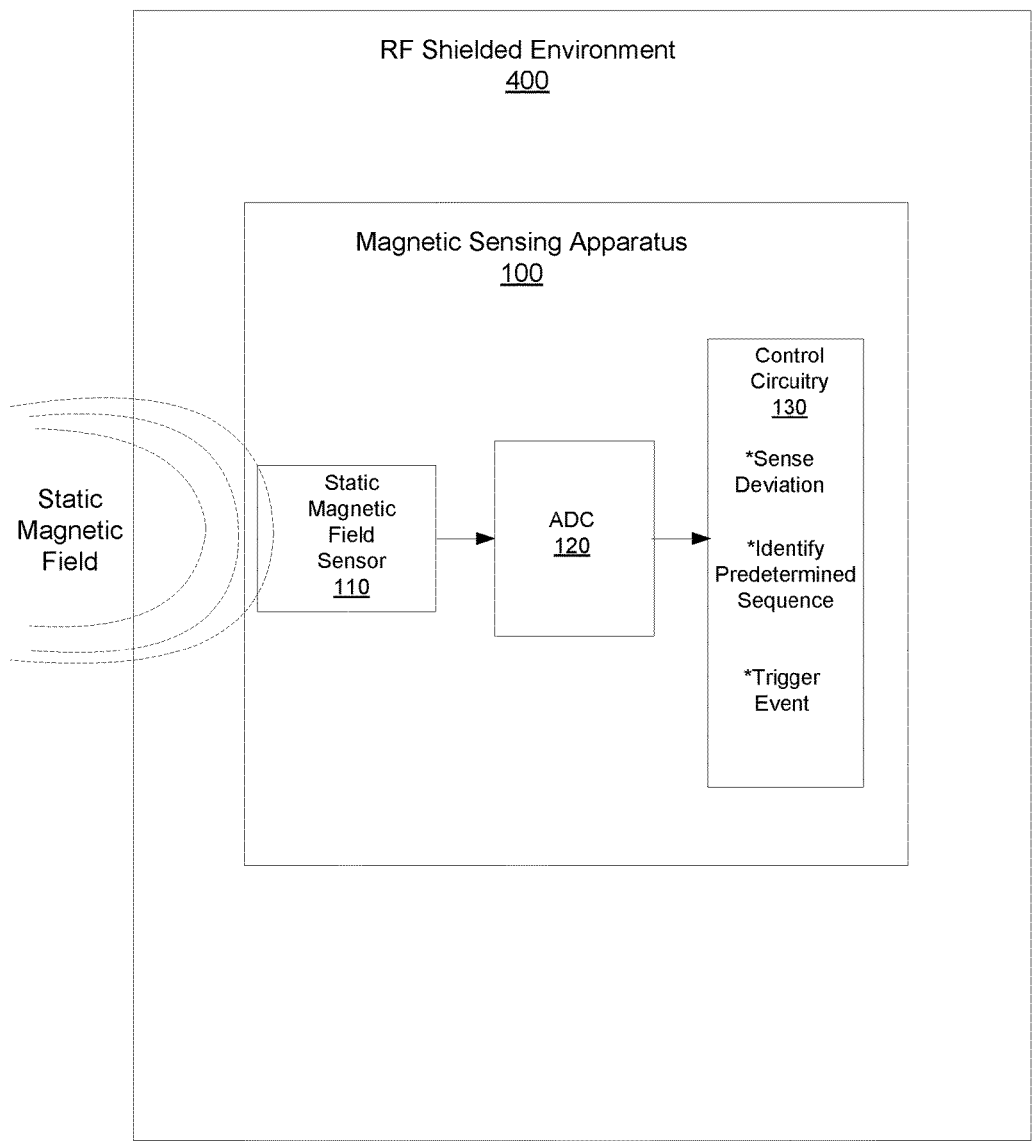
FIG. 4 shows a magnetic sensing apparatus within a shielded environment, according to an embodiment.

FIG. 4 shows a magnetic sensing apparatus within an RF shielded environment, according to an embodiment. That is, for an embodiment, the method of event triggering is operative in an RF (radio frequency) shielded environment. It is to be understood that the apparatus is further operative to operate in difficult to access environments, such as, underground or underwater.

Figure 5:
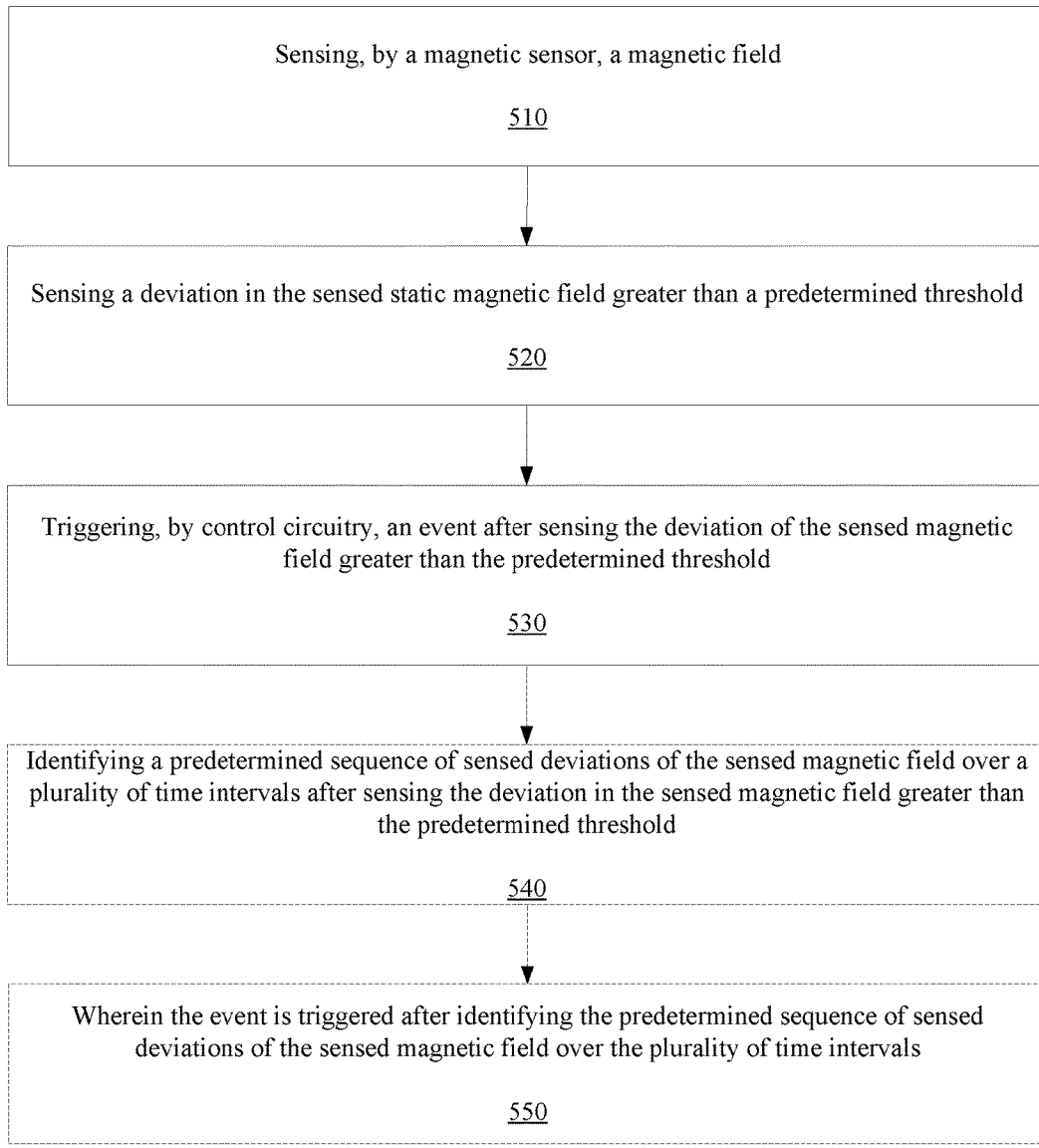
FIG. 5 is a flow chart that includes steps of a method of event triggering, according to an embodiment.

FIG. 5 is a flow chart that includes steps of a method of event triggering, according to an embodiment. A first step 510 includes sensing, by a magnetic sensor element, a magnetic field. A second step 520 includes sensing a deviation in the sensed magnetic field greater than a predetermined threshold. A third step 530 includes triggering, by control circuitry, an event after sensing the deviation of the sensed magnetic field greater than the predetermined threshold. An embodiment further includes a fourth step 540 that includes identifying a predetermined sequence of sensed deviations of the sensed magnetic field over a plurality of time intervals after sensing the deviation in the sensed magnetic field greater than the predetermined threshold. Further, a fifth step 550 includes the event being triggered after identifying the predetermined sequence of sensed deviations of the sensed magnetic field over the plurality of time intervals.

Figure 6:
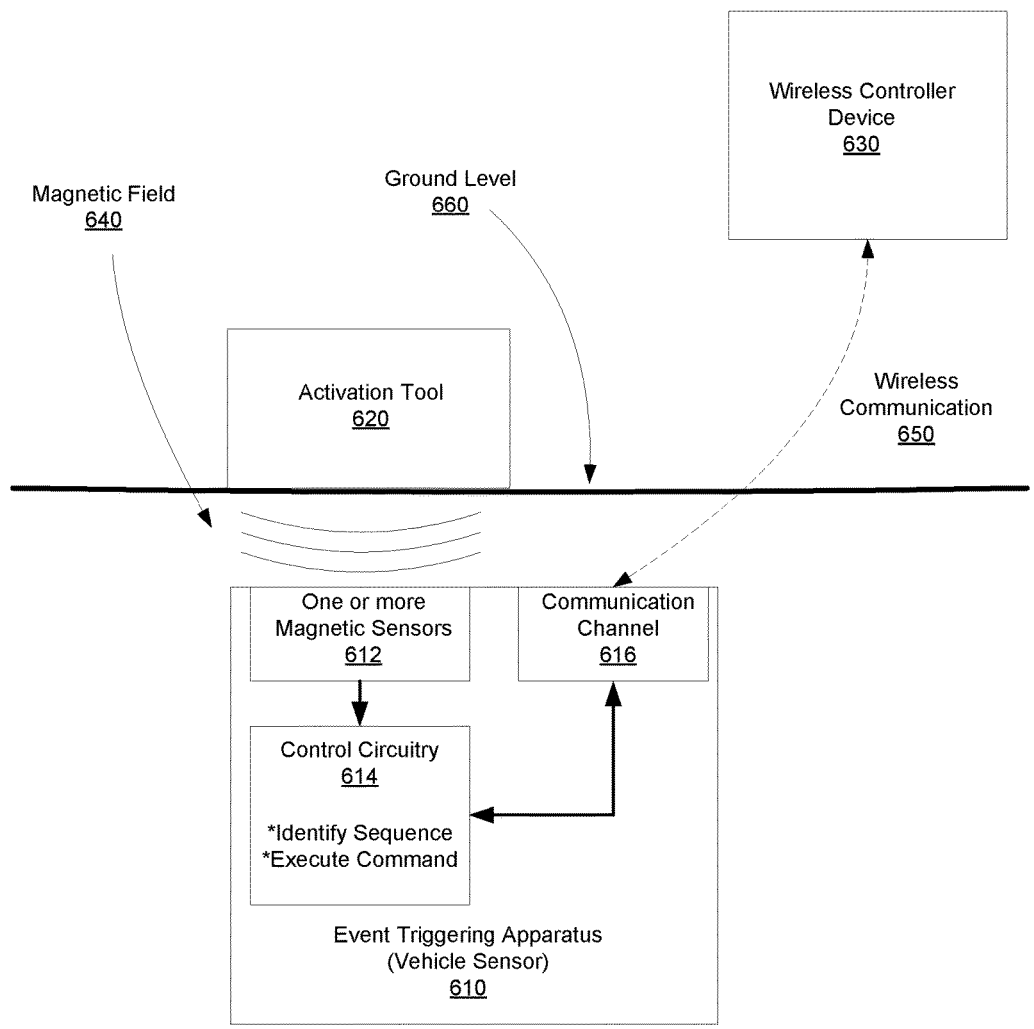
FIG. 6 shows a vehicle sensor apparatus and an activation tool, according to an embodiment.

FIG. 6 shows a vehicle sensor apparatus 610 (event triggering apparatus) and an activation tool 620, according to an embodiment. As shown, the vehicle sensor apparatus includes one or more magnetic sensors 612 for sensing a magnetic field. Further, control circuitry 614 monitors the sensed magnetic field and triggers an action based upon the sensed magnetic field satisfying a condition. For an embodiment, the condition includes a sensed deviation in the sensed magnetic field being greater than a predetermined threshold. For an embodiment, the condition further includes identifying a predetermined sequence of sensed deviations of the sensed magnetic field over a plurality of time intervals after sensing the deviation in the sensed magnetic field greater than the predetermined threshold.

As shown, for an embodiment, the activation tool 620 communicates with the vehicle sensor apparatus 610 through an applied magnetic field 640. Accordingly, the activation tool 620 can communicate with the vehicle sensor apparatus 610 when the vehicle sensor apparatus 610 is located in difficult to access environments, and environments that are RF shielded. As shown, the vehicle sensor apparatus 610 is located below ground level 660. For an embodiment, the vehicle sensor apparatus 610 is located underground for monitoring the presence or the lack of presence of a vehicle.

As shown, an embodiment of the vehicle sensor apparatus 610 includes a communication channel 616 which allows the vehicle sensor apparatus 610 to wirelessly communicate with a wireless controller device 630. Accordingly, sensing information or any other information of the vehicle sensor apparatus 610 can be uploaded to the wireless controller device 630 through the communication channel 650. The wireless controller device can be a mobile device or any other computing device, or a gateway that provides a connection between the vehicle sensor apparatus 610 and an upstream network, such as, the internet or cloud.

For at least some embodiments, the control circuitry 614 is operative to identify at least one of a plurality of predetermined sequences, and perform at least one of a plurality of commands based on the identification of the at least one of a plurality of predetermined sequences. For an embodiment, at least one of the plurality of commands includes activating electronic circuitry of the apparatus 610. For an embodiment, the command controls waking (powering) up portions of the control circuitry 614, or one or more other controllers of the apparatus 610. For an embodiment, the command controls activation of a high rate magnetic sensing. That is, first sense something of interest is sensed and the apparatus is activated. Once activated, the apparatus senses with greater sensitivity—which consumes more power. That is, only a minimal amount of circuitry within the apparatus 610 is activated to save power. If commanded, additional circuitry is activated. Accordingly, power used by the apparatus is used as needed in order for the apparatus 610 to properly operate, while conserving battery power. As previously stated, the apparatus can be placed in a difficult to reach environment, and therefore, conservation of a battery power is extremely important.

For an embodiment, at least one of the plurality of commands includes directing the apparatus to transition from a shipping mode to an operating mode, wherein the apparatus 610 consumes less power in the shipping mode than in the operating mode. That is, for an embodiment, the apparatus 610 is a contained device that is to be placed underground. Once underground, the apparatus 610 maintains a low-power operation unless conditions are determined that trigger the apparatus to activate at least portions of electronic circuitry of the apparatus.

Due to the apparatus 610 being deployed underground, for an embodiment, the apparatus is shipped from an apparatus producing company within a sealed package with no physical interface. For an embodiment, the predetermined threshold in the shipping mode is greater than the predetermined threshold in the operating mode. That is, for shipping, the predetermined threshold is set very high so that the apparatus does not activate when being shipped, and unnecessarily dissipate energy stored in the battery of the apparatus 610. After being shipped and after being deployed by being placed, for example, underground, for an embodiment, the apparatus is activated by, for example, by the activation tool 620 applying a magnetic field that includes a sequence that activates or commands the apparatus 610 to operate in a deployed mode or a non-shipping mode. As described, for an embodiment, the predetermined threshold is set very high in the shipping mode so that the device never activates, and then the predetermined threshold is lowered to an operating mode after being deployed, thereby allowing the apparatus to properly sense, for example, a vehicle proximate to the apparatus 610. That is, the shipping mode includes setting thresholds very high so that the device never wakes up before being deployed. Upon receiving a predetermined sequence, the thresholds are set for operational (non-shipping) mode.

For an embodiment, at least one of the plurality of commands includes directing the apparatus 610 to perform a hard reset of the apparatus. That is, for example, the activation tool 620 applies a magnetic field that includes a sequence that causes the apparatus 610 to completely reset and reboot. This is a very convenient means for resetting the apparatus 610 when the apparatus 610 is in a very difficult place to reach, such as, when placed underground.

For an embodiment, at least one of the plurality of commands includes directing the control circuitry 614 to be operative to receive a software update. As previously described, during deployment, the apparatus may be in a very difficult location for easy access, and power consumption of the apparatus 610 must be kept very low. Accordingly, for an embodiment, the activation tool 620 can apply a magnetic field with the proper sequence to cause the control circuitry 614 to put the apparatus 610 in a mode to receive a software update. The can include, for example, activating the communication channel 616 so that the apparatus 610 receives the software update from a mobile device, a gateway, or some other device through the wireless communication channel 650.

As previously described, for an embodiment, at least one of the plurality of commands includes activating one or more wireless communication channels of the apparatus. As previously described, for an embodiment, the activated one or more wireless communication channels are used to communicate with a gateway, wherein the gateway is connected to a network. As will be described, for an embodiment, the gateway is connected to the cloud (or any other type of network). When commanded, information is uploaded through the network to a cloud server. As will be described, for an embodiment, a plurality of apparatuses is connected to the cloud server or controller, and the cloud server or controller performs processing on information received from the vehicle sensing apparatus 610. While shown connected to a central server, it is to be understood that for an embodiment, different vehicle sensing apparatus are interconnected, and the controllers of the different vehicle sensing apparatus can perform distributed processing of information of the apparatuses.

For an embodiment, at least one of the plurality of commands includes directing the apparatus to transition from an operating mode to shipping mode.

For an embodiment, at least one of the plurality of commands includes directing the apparatus to transition from the default bootup mode to manufacturing mode. The default boot-up mode is typically the operating mode. The manufacturing mode sets the defines the networks keys for encrypting and decrypting uplink and downlink RF communications 650 for the communication channel 616 to a predetermined, secure IP address to the wireless controller device 630.

For an embodiment, the apparatus is further operative to provide an indication that the sensor of the apparatus is actively sensing a magnetic field. That is, for an embodiment, the magnetic sensor actively senses the magnetic field 640 once per a unit of time. For example, for an embodiment, the magnetic sensor senses the magnetic field 640 four times a second. For an embodiment, the apparatus 610 provides an indication of when the active sensing of the magnetic field 640 is occurring. For an embodiment, the magnetic sensor senses the magnetic field 640 once every other second when the vehicle sensor 610 is in shipping mode, thereby further saving power in shipping mode. The activation tool 620 can be used to confirm the vehicle sensor 610 was correctly placed into shipping mode by the activation tool 620 by sensing that the vehicle sensor 610 is actively sensing a magnetic field are a predefined magnetic sensor rate for shipping mode, such as 0.5 Hz. For an embodiment, providing an indication that the sensor of the apparatus is actively sensing a magnetic field comprises the apparatus generating a detectable magnetic field while the sensor is actively sensing the magnetic field.

For an embodiment, the indication that the sensor of the apparatus 610 is actively sensing a magnetic field, is used by an activation device 620 for synchronizing an applied magnetic field. That is, for an embodiment, the activation device 620 is operable to sense when the apparatus 610 is sensing the magnetic field 640. Accordingly, the activation device 620 can time or be synchronized when the activation device 620 applies the magnetic field 640. By synchronizing the applied magnetic field of the activation device 620 with timing of the sensing of the magnetic field by the apparatus, the sensing of sequences of magnetic field (as shown, for example, in FIG. 2) is more efficient and accurate.

For an embodiment, the apparatus includes a plurality of separate sensors, wherein the plurality of separate sensors generates a plurality of sensed magnetic fields, and wherein changes in a magnetic environment are detected based on the plurality of sensed magnetic fields. For an embodiment, the plurality of sensed magnetic fields is used to determine a magnetic gradient. The determined gradient indicates a change in magnetic field over a distance, wherein the distance between the sensors is known. Each sensor sensed a magnetic field, and the gradient determined. For an embodiment, the feature extractions from the sensed magnetic field can be used for estimating a speed of a sensed vehicle. For an embodiment, the sensed magnetic fields are uploaded to the gateway for processing. For an embodiment, the features extractions for the sensed magnetic field are uploaded to the gateway for processing. For an embodiment, the plurality of sensed magnetic fields can be used for correcting false positives in sensing the presence of a vehicle.

The detected changes in the environment can include, for example environmental factors that can cause false positives include changes to neighboring power lines, transient magnetic fields from passing trolleys or buses, and magnetic fields from vehicles from a neighboring parking space.

For an embodiment, the apparatus in conjunction with another apparatus is further operative to uniquely identify a vehicle. For an embodiment, arrays of sensors are used to identify vehicles. For an embodiment, a vehicle includes a device that aid in the identification of the vehicle—which is unique to the vehicle. Further, the identification can lead to a unique command. For example, identification of the vehicle can be used, for example, to activate the opening of a garage door or a gate based upon the identification of the vehicle.

For an embodiment, the magnetic field sensing is temperature compensated. For an embodiment, temperature compensation is applied to the raw magnetic sensor reading in the controller to enable the algorithms in the controller to process the signals with temperature compensated magnetic fields.

For an embodiment, the magnetic field sensing is calibrated for scale factor and offset. By calibrating for the local scale factor and offset of each apparatus, the magnetic field measured by the apparatus reports earth's geo-magnetic field, and thus when the measured magnetic field does not match the expected earth magnetic field, this information can be used to make algorithmic estimations such as vehicle speed or vehicle presence.

For an embodiment, the event triggering is operative in an RF (radio frequency) shielded environment.

As previously described, for an embodiment, the control circuitry 614 includes a controller. For an embodiment, the control circuitry 614 includes circuitry, such as, an FPGA (field programmable gate array), an ASIC (application specific integrated circuit), or other type of control circuitry. For an embodiment, the control circuitry 614 includes both a controller and other circuitry. For example, the control circuitry 614 includes an ASIC that communicates magnetic sensing data and generates an interrupt signal when the sensed magnetic field exceeds a threshold. The interrupt wakes up a controller which can then receive the magnetic sensing data. This embodiment advantageously allows the high-power controller to only be activated when the sensed magnetic field exceeds the threshold while the lower-power ASIC performs the magnetic sensing operations.

As previously described, for an embodiment, the one or more magnetic sensors 612 include a magnetic sensor. For an embodiment, the one or more magnetic sensors 612 include a magnetic sensor and some associated circuitry. For example, for an embodiment, the one or more magnetic sensors 612 include the magnetic sensor and an ADC. Further, for an embodiment, the embodiment, the one or more magnetic sensors 612 include the magnetic sensor, the ADC, and control circuitry, such as, an ASIC.

Figure 7:
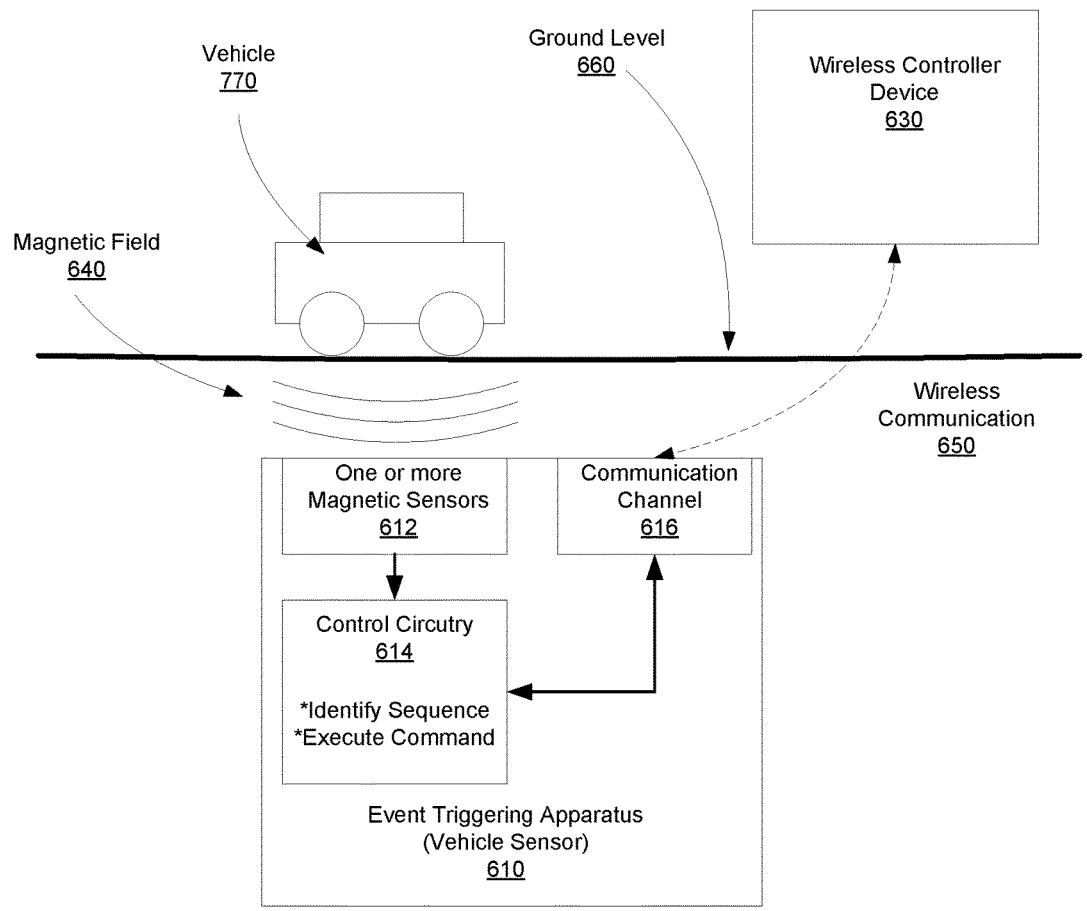
FIG. 7 shows a vehicle sensor apparatus sensing a vehicle, according to an embodiment.

FIG. 7 shows a vehicle sensor apparatus 610 sensing a vehicle 770, according to an embodiment. For this embodiment, the controller is further operative to detect a presence of the vehicle 770 based on sensing a signature of the sensed magnetic field that corresponds with the presence of the vehicle 770. That is, for an embodiment, the predetermined sequence sensed by the magnetic sensors 612 matches the signature of the sensed magnetic field of a vehicle being sensed.

For this embodiment, the control circuitry 614 is further operative to detect a speed of a vehicle 770 based on sensing a signature of the sensed magnetic field that corresponds with the speed of the vehicle. That is, for an embodiment, the predetermined sequence sensed by the magnetic sensors 612 matches the signature of the sensed magnetic field of the vehicle 770 at a particular speed.

For this embodiment, at least one of the plurality of commands includes directing the controller to provide selected information of the apparatus to the gateway. For an embodiment, the information includes the detection of the presence of a vehicle. That is, the predetermined sequence matches the signature that indicates the presence of a vehicle. The detected presence of the vehicle is communicated to the gateway.

For an embodiment, the apparatus includes a plurality of separate sensors, and the speed of a vehicle 770 is determined based on sensing one or more signatures of magnetic fields sensed by the separate sensors. By knowing the distance between the separate sensors of the apparatus, the speed of the vehicle 770 can be determined.

Introduction to an Embodiment of a Magnetic Field Sensor

Figure 8A:
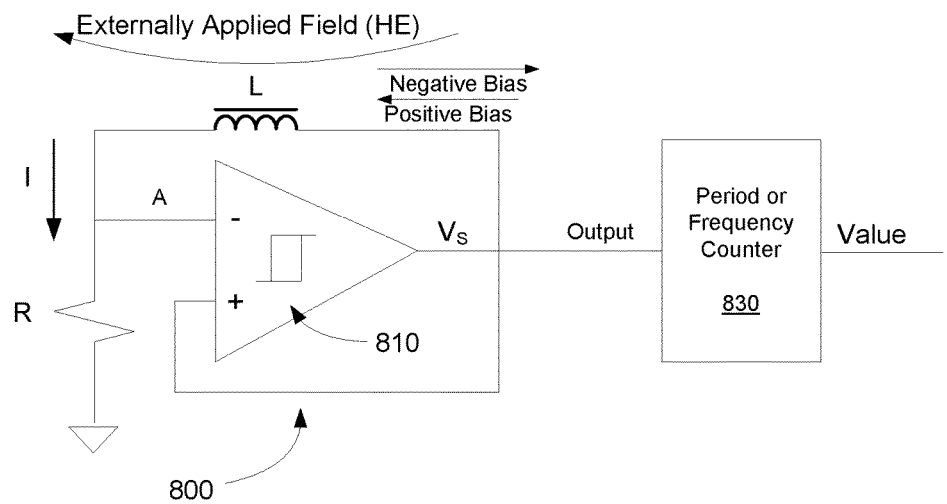
FIG. 8A shows an example of a magnetic field sensor that includes an oscillator, wherein a period of a signal generated by the oscillator is dependent upon an intensity of a sensed magnetic field.

FIG. 8A shows an example of a magnetic field sensor that includes an oscillator, wherein a period of a signal generated by the oscillator is dependent upon an intensity of a sensed magnetic field. The magnetic field sensor (magnetometer) that includes an oscillator 100, wherein a period of a signal generated by the oscillator 100 is dependent upon an intensity of a sensed external magnetic field. A frequency or period counter 130 receives an output signal of the oscillator. A value of an inductance L of the oscillator is dependent upon the intensity of the externally applied magnetic field. Therefore, the value at the output of the counter 130 is dependent upon the intensity of the externally applied magnetic field.

As shown, $H_E$ represents the external magnetic field parallel to the coil. The total magnetic field the sensor experiences, H, is a function of the external magnetic field and the magnetic field established by the current running through the circuit, I. This can be expressed as:

$$H = k_0 I + H_E$$

where $k_0$ is a constant that depends on certain physical parameters of the sensor.

Figure 8B:
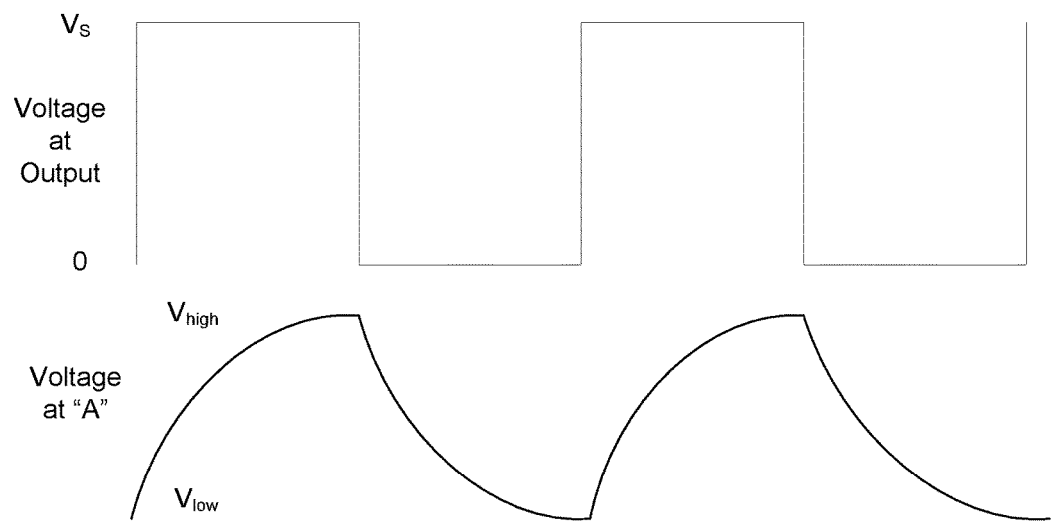
FIG. 8B shows an example of waveforms of the magnetic field sensor of FIG. 8A.

For the circuit of FIG. 8A, assuming a logical "0" value (0V or some value less than the trigger value) on an input to a Schmitt trigger 110, the Schmitt trigger yields an output value that is a logical "1" at some voltage $V_S$. This gradually drives up an input voltage across the sensor 800 until the voltage at (A) reaches a trigger threshold for the Schmitt Trigger, $V_H$. At this point, the Schmitt Trigger 810 detects the voltage at A as a logical "1", and the output of the Schmitt Trigger 810 becomes a logical "0". This drives the voltage down across the sensor 800, setting up an oscillation as depicted below in FIG. 8B. Note that the current, I, essentially mimics the voltage waveform at A. FIG. 8B shows an example of waveforms of the magnetic field sensor of FIG. 8A For at least some embodiments, the magnetic field sensor 800 incorporates a solenoidal-geometry coil (L) wrapped around a high-permeability magnetic core. The sensor's permeability, varies with the applied magnetic field, and consequently, the sensor's inductance, L, is also a function of the magnetic field, H.

For the circuit depicted in FIG. 8A, the bias resistance, R, and drive voltage on the Schmitt Trigger 810 output ($V_S$) are selected such that the sensor's magnetic field is in the non-linear regime of the permeability curve.

Figure 9:
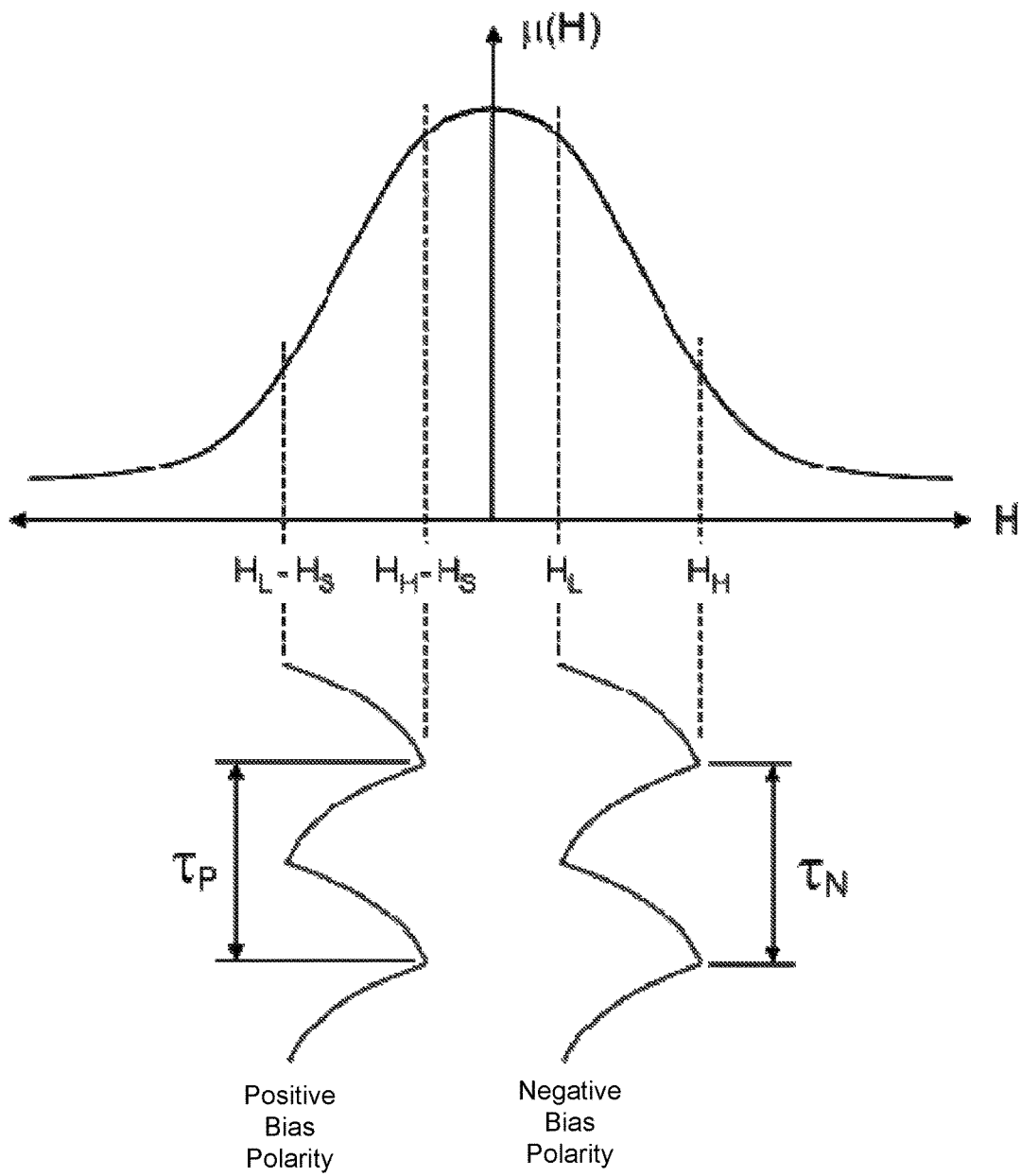
FIG. 9 shows examples of waveforms of a magnetic field sensor which is not exposed to an applied external field.

FIG. 9 shows examples of waveforms of a field sensor which is not exposed to an applied external field. That is, FIG. 9 depicts the voltage output when the circuit is driven with either a positive or negative bias (as depicted in FIG. 8A), but with no applied external magnetic field. Note that the period of oscillation is the same whether the circuit is positively or negatively biased.

Figure 10:
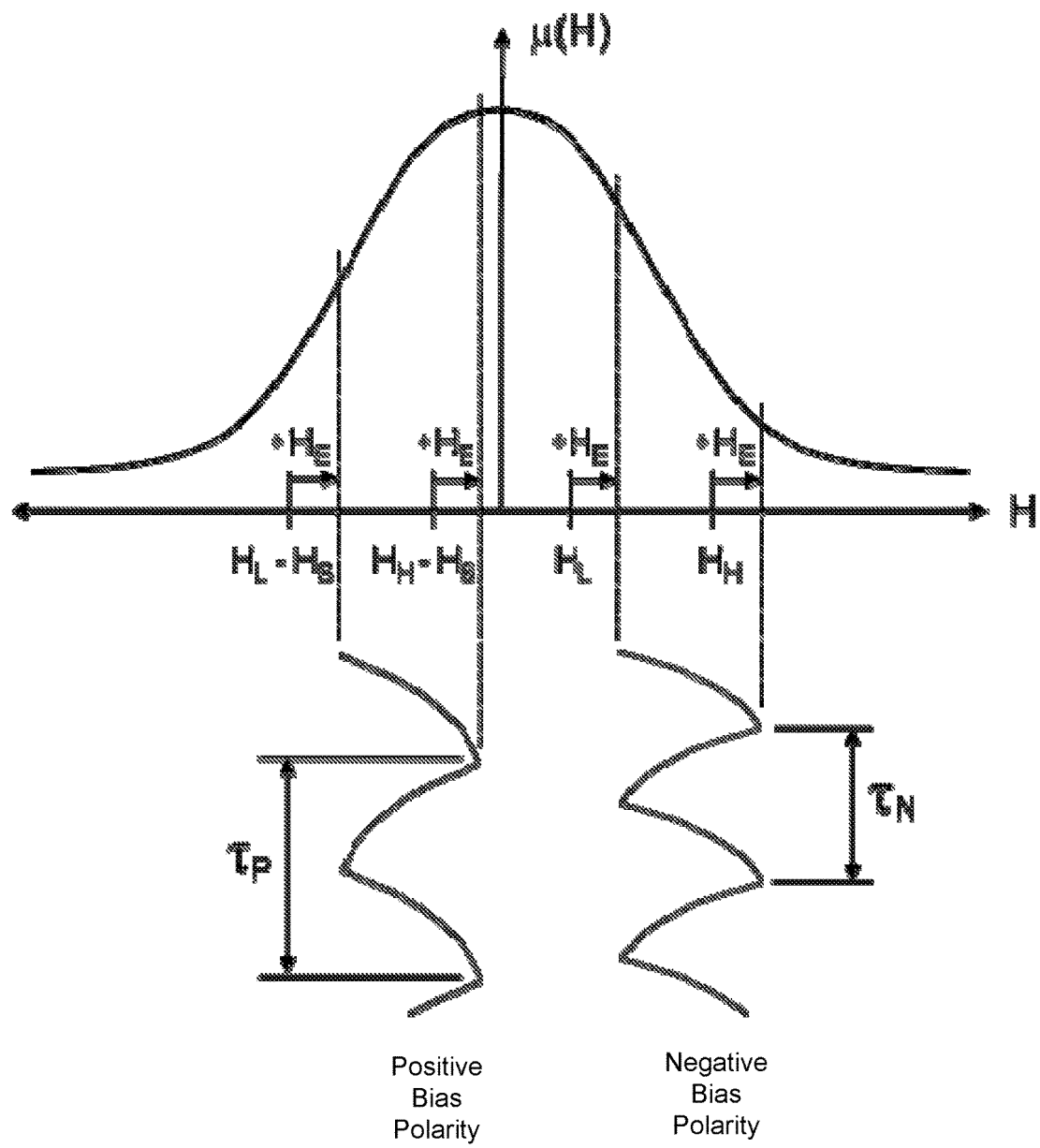
FIG. 10 shows examples of waveforms of a magnetic field sensor which is exposed to an applied external field.

When an external magnetic field is applied, $H_E$ (such as Earth's magnetic field), this causes both the positively and negatively biased curves to shift in the same direction. FIG. 10 shows examples of waveforms of a field sensor which is exposed to an applied external field. As depicted in FIG. 10, this shift causes the inductance to increase when the circuit is positively biased and to decrease when negatively biased. This, in turn, causes the period between cycles, τ, to increase for the positively biased circuit and decrease for the negatively biased circuit.

By measuring the time to complete a fixed number of oscillations (periods) that occur in the forward and reverse polarity directions and taking the difference between these two values, it is possible to derive the intensity and direction of the external magnetic field.

The magneto-inductive sensing of the sensor of FIG. 8A provides some particularly useful attributes that set it apart from other magnetic sensing technologies. More specifically the output value can be represented digitally. Most other technologies provide an analog output which can be used to derive the strength of the applied magnetic field by observing a change in voltage. In this case, noise either inherent in the circuit or from the surrounding effects the attainable resolution.

Figure 11:
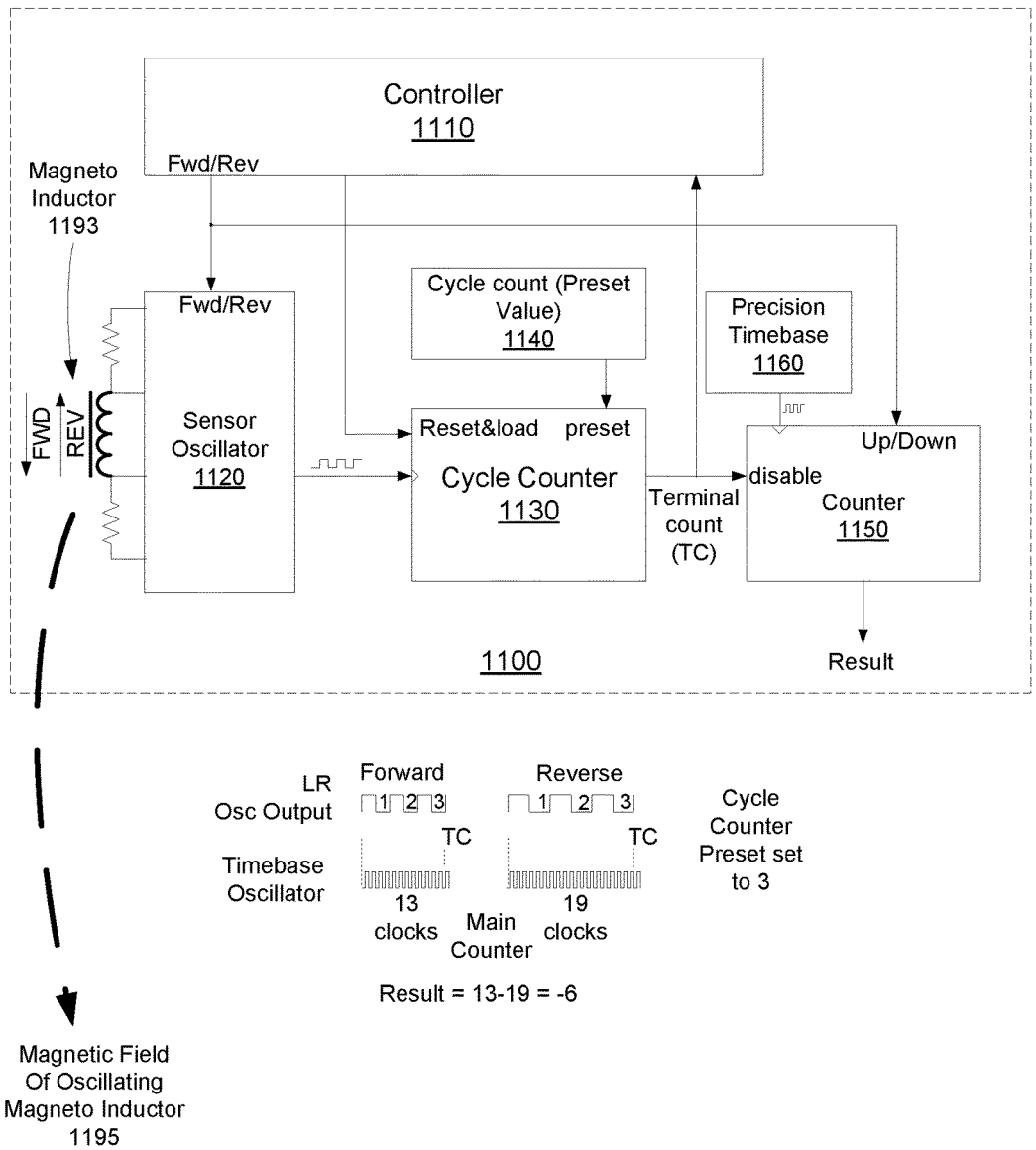
FIG. 11 shows an example of a magnetic field sensor that includes a pair of counters for providing a value representing an intensity and direction of a sensed magnetic field, according to an embodiment.

FIG. 11 shows an example of a magnetic field sensor 1100 that includes a pair of counters 1130, 1150 for providing a value representing an intensity and direction of a sensed magnetic field. The sensor 1100 includes a sensor oscillator 420 that can be similar in structure to the sensor of FIG. 8.

The sensor oscillator 1120 includes forward and reverse bias settings as controlled by a controller 1110. Basically, the controller 1110 sets a bias current through an inductor 1193 (for example, a solenoidal-geometry coil) in a forward direction (FWD) and in a reverse direction (REV). By determining the period and/or frequency variation of the output of the sensor oscillator for both the FWD and REV directions, the intensity and direction of the sensed magnetic field can be determined.

A cycle counter 1130 counts cycles of the output of the sensor oscillator up to a preset value as determined by a count cycle 1140. After the cycle counter 1130 has counted to the preset value, the cycle counter 1130 generates a terminal count (TC).

A counter 1150 times the period required for the cycle counter 1130 to generate a TC by counting a clock signal of a precision time-base 1160. That is, the counter 1150 is enabled and set to count (the clock signal) when the controller 1110 sets the sensor oscillator in, for example, the FWD direction. The counter 1150 is set to count up for one direction of the bias current, and set to count down for the other direction of the bias current. The result of the counter is dependent on the intensity of the applied magnetic field and the direction of the applied magnetic field. As shown in FIG. 11, an example of a preset value of the count cycle is 3. The counter 1150 counts the high-speed clock cycle over the duration of time it takes for the cycle counter 1130 to count 3 cycles of the output signal of the sensor oscillator 1120. The example of FIG. 11 shows the counter 1150 counting to 13 for the FWD bias, and counting down 19 for the REV bias, yielding a counter result of −6. This output (−6) provides an accurate representation of the intensity and direction of the sensed magnetic field.

The sensitivity of the magnetic sensor and sampler combination 1100 can be increased by increasing the value of the count cycle. That is, as the time period of the counting is increased, the sensitivity and signal to noise ratio (SNR) increases. However, at some point, the SNR of the sampled signal can no longer be improved due to the presence of 1/f noise of the sensor oscillator.

As previously described, the sensor oscillator 1120 includes forward and reverse bias settings as controlled by a controller 1110. Basically, the controller 1110 sets a bias current through the magneto inductor 1193 in a forward direction (FWD) and in a reverse direction (REV). By determining the period and/or frequency variation of the output of the sensor oscillator for both the FWD and REV directions, the intensity and direction of the sensed magnetic field can be determined. As described, the bias current of the magneto inductor 1193 only occurs while sensing the magnetic field by the sensor 1100. A magnetic field is naturally produced by the magneto inductor 1193 while the sensor oscillator 1120 is actively oscillating. Accordingly, the magneto inductor 1193 produces a magnetic field 1195 while the magnetic sensor 1100 is actively sensing. The magnetic field 1195 can be sensed by the activation device 620, thereby allowing the activation device 620 to synchronize the applied magnetic field of the activation device 620 with the magnetic sensing of the magnetic sensor 1100.

Figure 12:
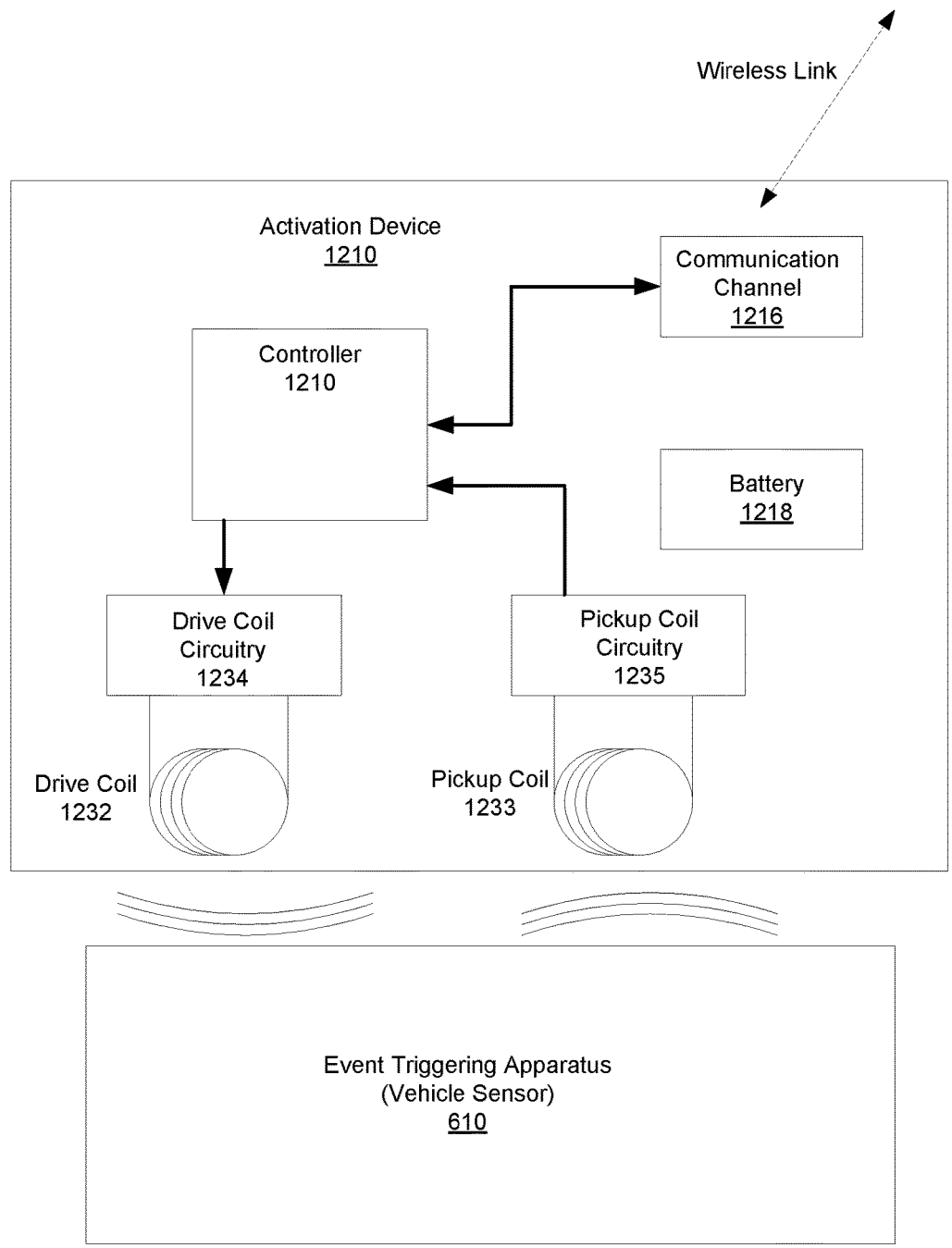
FIG. 12 shows an activation device, according to an embodiment.

FIG. 12 shows an activation device 1200, according to an embodiment. As shown, the activation device 1200 includes a drive coil 1232 which is operable to generate a magnetic field that is applied to, for example, the vehicle sensing apparatus 610. The applied magnetic field generated by the drive coil 1232 includes the sequences for commanding operation of the vehicle sensing apparatus 610.

As previously described, for an embodiment, the vehicle sensing apparatus 610 generates a magnetic field while the vehicle sensing apparatus 610 is sensing a magnetic field. For an embodiment, the pickup coil 1233 of the activation device 1200 is operable to sense the magnetic field generated by the vehicle sensing apparatus 610.

For at least some embodiments, a controller 1210 of the activation device 1200 controls drive coil circuitry 1234 and pickup coil circuitry 1235, and accordingly, synchronizes the applied magnetic field of the drive coil 1232 with the magnetic field sensed by the pickup coil 1233.

Figure 13:
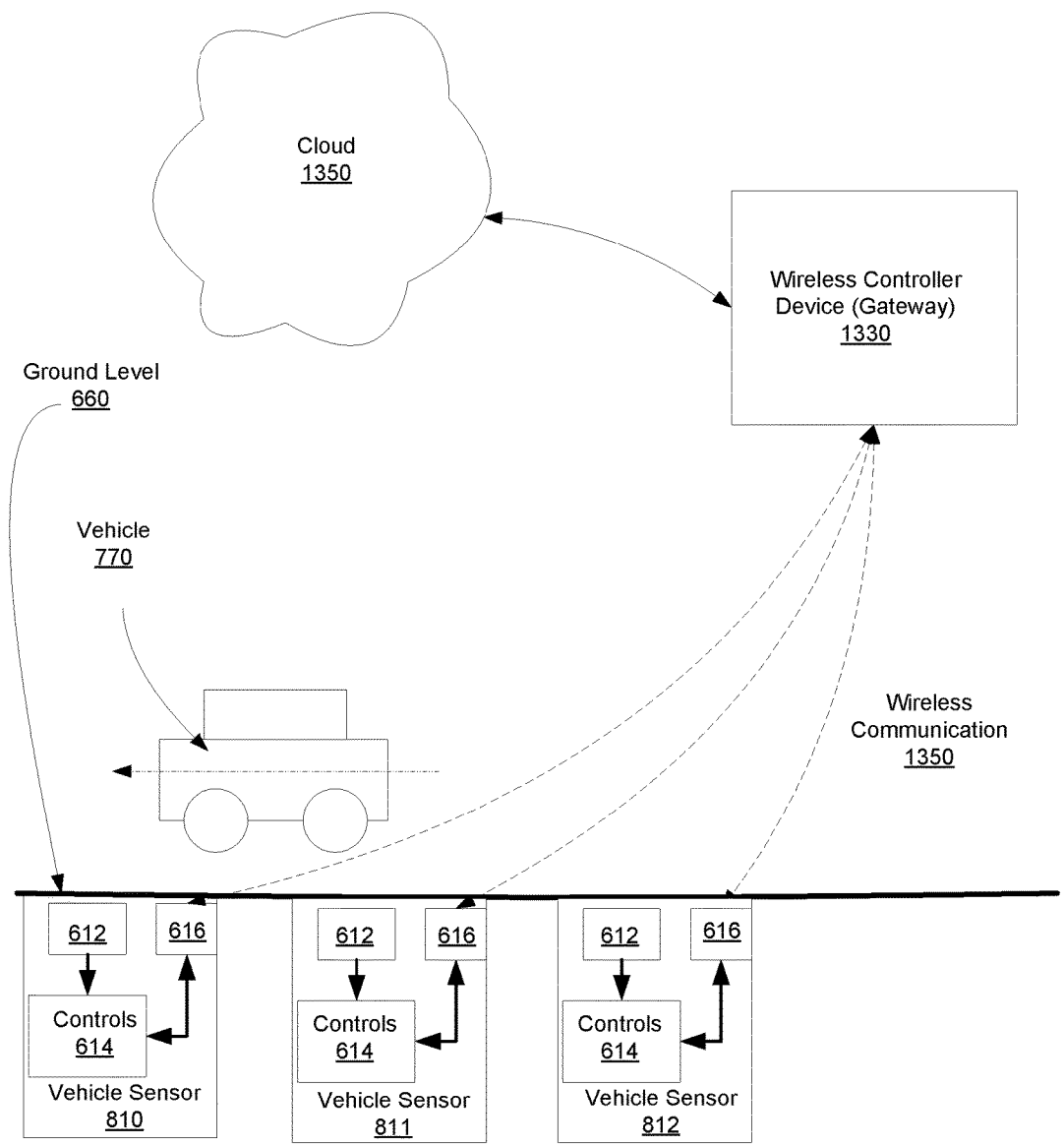
FIG. 13 shows an array of vehicle sensor apparatuses wirelessly connected to a gateway, according to an embodiment.

For at least some embodiments, the activation device 1200 is a mobile device that includes a battery 1218 and a wireless communication channel 1216. The wireless communication channel 1216 enables the activation device to interact with other mobile devices or a backend server. Accordingly, the activation device 1200 can receive instructions and/or information from other devices, and can provide instructions and/or information to other devices FIG. 13 shows an array of vehicle sensors wirelessly connected to a gateway, according to an embodiment. For an embodiment, each of the vehicle sensor apparatuses is place underground proximate to a parking location of a parking area. Accordingly, each sensor can monitor whether a parking location of the parking area is occupied or not. That is, if the parking location of a vehicle sensor apparatus is occupied, the vehicle sensor apparatus will sense through its magnet sensor a magnetic field that matches a signature that indicates the parking location is occupied. Further, if the parking location of the vehicle sensor apparatus is not occupied, the vehicle sensor apparatus will sense through its magnet sensor a magnetic field that does not match a signature that indicates the parking location is occupied.

Further, as described, a neighboring proximate vehicle sensor apparatus may be used to confirm a vehicle sensor apparatus properly senses a vehicle. That is, different types of vehicles will provide different magnetic field signatures. A particular large vehicle may possibly trigger a false positive with a neighboring vehicle sensor apparatus of a neighboring parking location. Other proximate vehicle sensor apparatus may be used to further confirm whether a vehicle is actually within the parking location of the vehicle sensor apparatus.

For an embodiment, multiple vehicle sensor apparatuses may be used for determining the speed of a vehicle. That is, by knowing the distance between neighboring vehicle sensor apparatuses and the timing in which each senses a vehicle, it is possible to estimate the speed of the vehicle.

As shown, the vehicle sensor apparatuses 810, 811, 812 are interfaced with a wireless device controller 1330 that wireless communication 1350 supported by the communication channels 616. The controller may be an upstream server or a cloud server, wherein a gateway provides access to the cloud server. For an embodiment, the vehicle sensor apparatuses 810, 811, 812 are at least partially controlled by the wireless device controller 1330. For an embodiment, the vehicle sensor apparatuses 810, 811, 812 provided sensed information to the wireless device controller 1330. Accordingly, the wireless device controller 1330 can coordinate control of the vehicle sensor apparatuses 810, 811, 812. Further, the wireless device controller 1330 collects and processes information of the vehicle sensor apparatuses 810, 811, 812.

Figure 14:
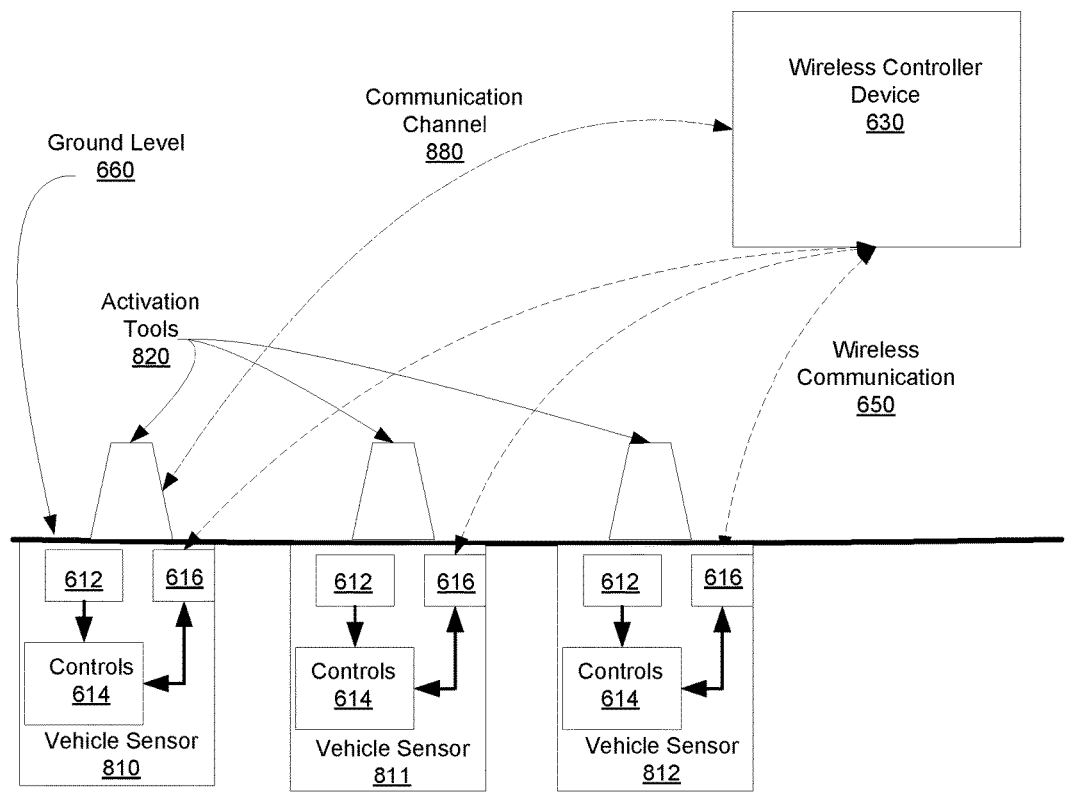
FIG. 14 shows an array of vehicle sensor apparatuses and activation devices wirelessly connected to a gateway, according to an embodiment.

FIG. 14 shows an array of vehicle sensor apparatuses and activation devices wirelessly connected to a gateway, according to an embodiment. For this embodiment, the wireless device controller 1330 can control and collect information from the vehicle sensors apparatuses 810, 811, 812, and can control and collect information from the activation tools 820. For an embodiment, the activation devices can take the form, for example, of orange cone that are place proximate to multiple different parking locations. Accordingly, the vehicle sensor apparatus for different parking locations can be activated by the activation tools 820. The activated vehicle sensor apparatuses can be instructed to provide information to the wireless controller device.

Figure 15:
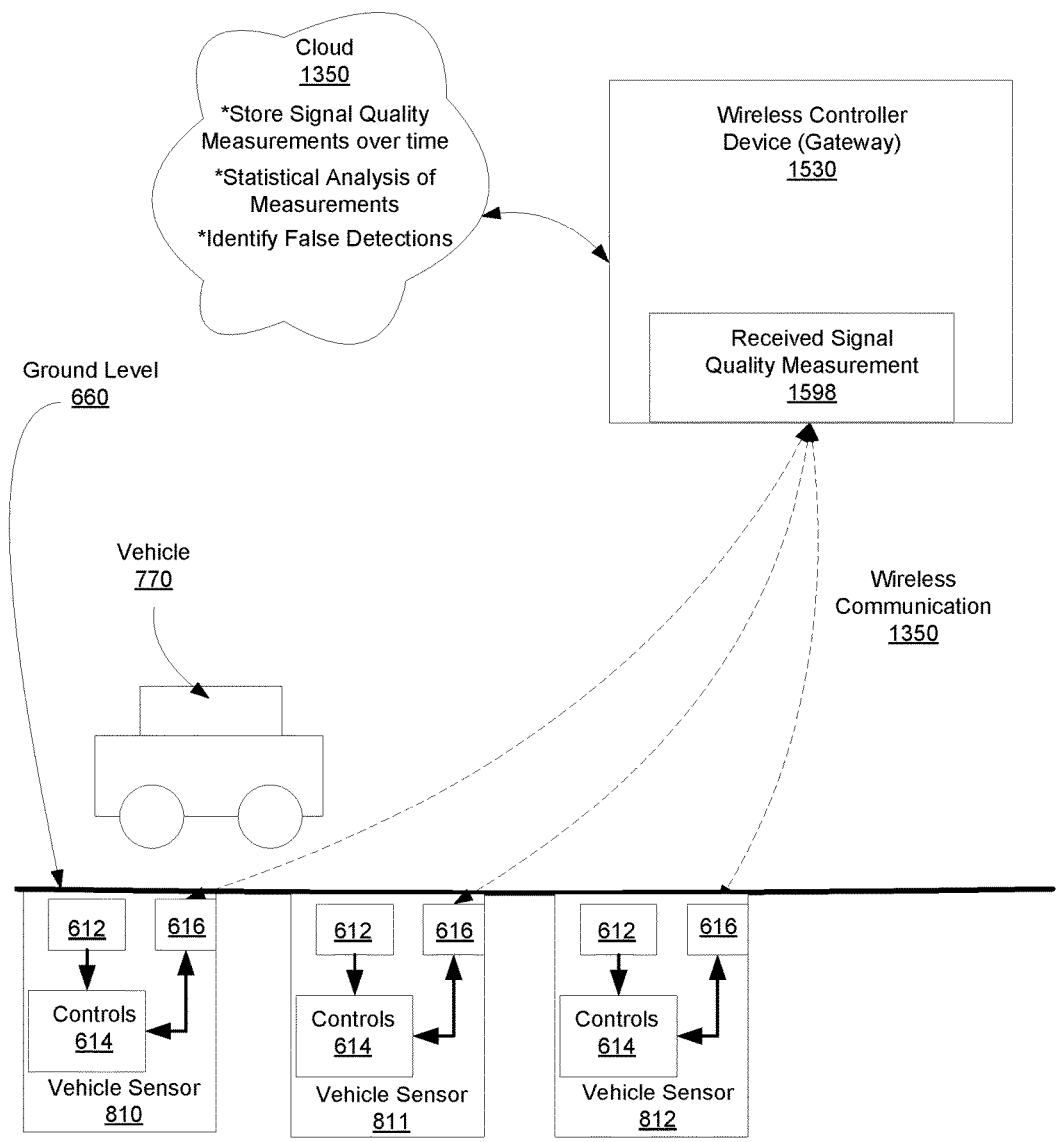
FIG. 15 shows an array of vehicle sensor apparatuses wirelessly connected to a gateway, wherein the gateway monitors a receive signal quality of wireless signals received from the vehicle sensor apparatuses, according to an embodiment.

FIG. 15 shows an array of vehicle sensors wirelessly connected to a gateway, wherein the gateway monitors a receive signal quality of wireless signals received from the vehicle sensors, according to an embodiment. For an embodiment, when a vehicle sensing apparatus 810, 811, 812 senses the presence of a vehicle 770, the vehicle sensing apparatus communicates the presence of the vehicle 770 to a wireless controller device 1530. For an embodiment, the wireless controller device 1530 includes a gateway that in connected through a network to the cloud 1350.

For an embodiment, when the wireless controller device 1530 receives a wireless signal from one of the vehicle sensor apparatuses 810, 811, 812, the wireless controller device 1530 measures or characterizes (1598) a signal quality of the received wireless signal. In some situations, the quality of the received wireless signal provides an indication of whether the parking location of the vehicle sensor apparatus is occupied or not. Accordingly, the wireless controller device 1530 can monitor the signal quality of the wireless signal received from a vehicle sensor apparatus over time. Therefore, if the wireless controller device 1530 sensed a deviation of the quality of the received wireless signal, the wireless controller device 1530 can detect that the vehicle sensor apparatus may have provided a false positive in the sensing of the presence of a vehicle.

For an embodiment, the quality of the received wireless signal includes at least one of a signal to noise ratio (SNR), a packet error rate (PER), a bit error rate (BER), a received signal strength (RSSI), or some other indicator of the quality of the received wireless signal. The presence of a vehicle may operate to attenuate wireless signal, and therefore, the signal quality is worse when a vehicle is present. The degradation of quality of the received wireless signal can be confirmed by the vehicle sensing apparatus.

In real-world situations, environmental conditions of the vehicle sensor apparatuses 810, 811, 812 may change such that the magnetic sensing loses accuracy. In these situations, the monitoring of the received wireless signals can be useful for detecting changes in the conditions.

As shown, the wireless controller device (gateway) 1530 is network connected to the cloud 1350. Further, for an embodiment, the wireless controller device (gateway) 1530 monitors the signal quality (1598) of wireless signals received from the vehicle sense apparatuses 810, 811, 812. For an embodiment, the vehicle sense apparatuses 810, 811, 812 activate upon sensing a vehicle. Therefore, the wireless controller device (gateway) 1530 measures the quality of the received wireless signal upon receiving one or more wireless signals from the vehicle sense apparatuses 810, 811, 812 that sense a vehicle. For an embodiment, the wireless controller device (gateway) 1530 provides both the indication of a sensed vehicle by the vehicle sensing apparatus and the quality of the wireless signal received from the vehicle sensing apparatus. By monitoring this information over time, false positives of the vehicle sensing can be determined. For at least some embodiments, the cloud 1350 processing further communicates the detected false positive to the corresponding vehicle sensing apparatus through the wireless controller device (gateway) 1530.

Although specific embodiments have been described and illustrated, the described embodiments are not to be limited to the specific forms or arrangements of parts so described and illustrated. The embodiments are limited only by the appended claims.

What is claimed:

1. An apparatus, comprising:
a sensor element operative to sense a magnetic field; and
apparatus control circuitry, wherein the apparatus control circuitry receives a representation of the sensed magnetic field, and wherein the apparatus control circuitry is operative to:
sense a deviation in the sensed magnetic field greater than a predetermined threshold;
trigger an event after sensing the deviation of the sensed magnetic field greater than the predetermined threshold; and
identify a predetermined sequence of sensed deviations of the sensed magnetic field over a plurality of time intervals after sensing the deviation in the sensed magnetic field greater than the predetermined threshold; and wherein
the event is triggered after identifying the predetermined sequence of sensed deviations of the sensed magnetic field over the plurality of time intervals.

2. The apparatus of claim 1, wherein the apparatus control circuitry is further operative to:
identify at least one of a plurality of predetermined sequences;
perform at least one of a plurality of commands based on the identification of the at least one of a plurality of predetermined sequences.

3. The apparatus of claim 2, wherein at least one of the plurality of commands includes activating electronic circuitry of the apparatus.

4. The apparatus of claim 2, wherein at least one of the plurality of commands includes directing the apparatus to transition from a shipping mode to an operating mode, wherein the apparatus consumes less power in the shipping mode than in the operating mode.

5. The apparatus of claim 2, wherein at least one of the plurality of commands includes directing the apparatus to perform a hard reset of the apparatus.

6. The apparatus of claim 2, wherein at least one of the plurality of commands includes directing the apparatus control circuitry to be operative to receive a software update.

7. The apparatus of claim 2, wherein at least one of the plurality of commands includes activating one or more wireless communication channels of the apparatus.

8. The apparatus of claim 7, wherein the activated one or more wireless communication channels are used to communicate with a gateway, wherein the gateway is connected to a network.

9. The apparatus of claim 8, wherein at least one of the plurality of commands includes directing the apparatus control circuitry to provide selected information of the apparatus to the gateway.

10. The apparatus of claim 1, wherein the apparatus is further operative to provide an indication that the sensor element of the apparatus is actively sensing a magnetic field.

11. The apparatus of claim 10, wherein providing an indication that the sensor element of the apparatus is actively sensing a magnetic field comprises the apparatus generating a detectable magnetic field while the sensor element is actively sensing the magnetic field.

12. The apparatus of claim 10, wherein the indication that the sensor element of the apparatus is actively sensing a magnetic field, is used by an activation device for synchronizing an applied magnetic field.

13. The apparatus of claim 1, wherein the apparatus control circuitry is further operative to detect a presence of a vehicle based on sensing a signature of the sensed magnetic field that corresponds with the presence of the vehicle.

14. The apparatus of claim 1, wherein the apparatus control circuitry is further operative to detect a speed of a vehicle based on sensing a signature of the sensed magnetic field that corresponds with the speed of the vehicle.

15. The apparatus of claim 1, wherein the apparatus is located underground.

16. The apparatus of claim 1, wherein the magnetic field sensing is temperature compensated.

17. The apparatus of claim 1, wherein the magnetic field sensing is calibrated for scale factor and offset.

18. The apparatus of claim 1, wherein the event triggering is operative in an RF (radio frequency) shielded environment.

19. The apparatus of claim 1, wherein triggering an event includes waking up associated electronic circuitry.

20. The apparatus of claim 1, wherein triggering an event includes providing access.

21. The apparatus of claim 1, wherein triggering an event includes an unlocking mechanism.

22. An apparatus, comprising:
a sensor element operative to sense a magnetic field; and
apparatus control circuitry, wherein the apparatus control circuitry receives a representation of the sensed magnetic field, and wherein the apparatus control circuitry is operative to:
sense a deviation in the sensed magnetic field greater than a predetermined threshold; and
trigger an event after sensing the deviation of the sensed magnetic field greater than the predetermined threshold;
wherein the apparatus comprises a plurality of separate sensor elements, and wherein the plurality of separate sensor elements generates a plurality of sensed magnetic fields, wherein changes in a magnetic environment are detected based on the plurality of sensed magnetic fields.

23. An apparatus, comprising:
a sensor element operative to sense a magnetic field; and
apparatus control circuitry, wherein the apparatus control circuitry receives a representation of the sensed magnetic field, and wherein the apparatus control circuitry is operative to:
sense a deviation in the sensed magnetic field greater than a predetermined threshold; and
trigger an event after sensing the deviation of the sensed magnetic field greater than the predetermined threshold;
wherein the apparatus comprises a plurality of separate sensor elements, and wherein a speed of a vehicle is determined based on sensing one or more signatures of magnetic fields sensed by the separate sensor elements.

24. An apparatus, comprising:
a sensor element operative to sense a magnetic field; and
apparatus control circuitry, wherein the apparatus control circuitry receives a representation of the sensed magnetic field, and wherein the apparatus control circuitry is operative to:
sense a deviation in the sensed magnetic field greater than a predetermined threshold; and
trigger an event after sensing the deviation of the sensed magnetic field greater than the predetermined threshold;
wherein the apparatus in conjunction with another apparatus is further operative to uniquely identify a vehicle.

25. A method, comprising:
sensing, by a magnetic sensor element, a magnetic field;
sensing a deviation in the sensed magnetic field greater than a predetermined threshold; and
triggering, by control circuitry, an event after sensing the deviation of the sensed magnetic field greater than the predetermined threshold; and
identify a predetermined sequence of sensed deviations of the sensed magnetic field over a plurality of time intervals after sensing the deviation in the sensed magnetic field greater than the predetermined threshold; and wherein
the event is triggered after identifying the predetermined sequence of sensed deviations of the sensed magnetic field over the plurality of time intervals.

26. The method of claim 25, further comprising:
identifying a predetermined sequence of sensed deviations of the sensed magnetic field over a plurality of time intervals after sensing the deviation in the sensed magnetic field greater than the predetermined threshold; and wherein
the event is triggered after identifying the predetermined sequence of sensed deviations of the sensed magnetic field over the plurality of time intervals.

27. The method of claim 26, further comprising:
identifying at least one of a plurality of predetermined sequences;
performing, by the control circuitry, at least one of a plurality of commands based on the identification of the at least one of a plurality of predetermined sequences.

28. A system, comprising:
a gateway,
a plurality of apparatus, wherein one or more of the plurality of apparatus includes:
a sensor element operative to sense a magnetic field;
apparatus control circuitry, wherein the apparatus control circuitry receives a representation of the sensed magnetic field, and wherein the apparatus control circuitry is operative to:
sense a deviation in the sensed magnetic field greater than a predetermined threshold; and
trigger an event after sensing the deviation of the sensed magnetic field greater than the predetermined threshold;
upload information to the gateway upon triggering the event;
identify a predetermined sequence of sensed deviations of the sensed magnetic field over a plurality of time intervals after sensing the deviation in the sensed magnetic field greater than the predetermined threshold; and wherein
the event is triggered after identifying the predetermined sequence of sensed deviations of the sensed magnetic field over the plurality of time intervals;
wherein the gateway is connected to a network controller, wherein the network controller is operative to perform processing on information uploaded from the plurality of the apparatuses.

29. The system of claim 28, wherein the uploaded information includes time stamps.

* * * * *